United States Patent [19]

Ohtake et al.

[11] Patent Number: 4,954,304

[45] Date of Patent: Sep. 4, 1990

[54] PROCESS FOR PRODUCING PREPREG AND LAMINATED SHEET

[75] Inventors: Toshikazu Ohtake; Munekazu Hayashi; Satoshi Idemura; Kazumi Ohi; Yuji Kunitake, all of Chiba, Japan

[73] Assignee: Dainippon Ink and Chemical, Inc., Tokyo, Japan

[21] Appl. No.: 331,144

[22] Filed: Mar. 31, 1989

[30] Foreign Application Priority Data

Apr. 4, 1988 [JP] Japan .................................. 63-81329
Sep. 12, 1988 [JP] Japan ................................ 63-227784
Sep. 26, 1988 [JP] Japan ................................ 63-240462

[51] Int. Cl.$^5$ ............................................. B29C 67/12
[52] U.S. Cl. ..................................... 264/137; 264/257
[58] Field of Search ............... 264/135, 136, 137, 257, 264/258; 524/508, 502

[56] References Cited

FOREIGN PATENT DOCUMENTS 59-49240  3/1984  Japan .

*Primary Examiner*—Jay H. Woo
*Assistant Examiner*—Jeremiah F. Durkin, II
*Attorney, Agent, or Firm*—Armstrong, Nikaido, Marmelstein, Kubovcik & Murray

[57] ABSTRACT

A process for producing a prepreg and a process for producing a laminated sheet therefrom are disclosed, the process for producing a prepreg comprising impregnating a fibrous base with an impregnating resin composition essentially comprising ($A_1$) a room temperature liquid epoxy resin, ($A_2$) an epoxy resin curing agent, ($B_1$) a resin containing a polymerizable unsaturated group, ($B_2$) a room temperature liquid polymerizable vinyl monomer, and ($B_3$) a polymerization initiator and containing no solvent other than said polymerizable vinyl monomer ($B_2$), to obtain an impregnated base, and then removing the polymerizable vinyl monomer present in said impregnated base and converting the resin components to the B-stage. The prepreg is tack-free and soft, and the laminated sheet obtained therefrom has improved metal foil peel strength and interlaminar peel strength.

19 Claims, No Drawings

PROCESS FOR PRODUCING PREPREG AND LAMINATED SHEET

FIELD OF THE INVENTION

This invention relates to a process for producing a prepreg excellent in peel strength when adhered to a metal foil (hereinafter referred to as metal foil peel strength) and adhesion to a fibrous base (hereinafter referred to as interlaminar peel strength) and a laminated sheet obtained therefrom which is useful as a base for printed circuit boards and the like.

BACKGROUND OF THE INVENTION

It is well known that laminated sheets or boards can be obtained by impregnating a fibrous base, such as glass cloth, glass fiber nonwoven cloth, and chopped strand glass, with an impregnating resin composition diluted with a solvent, followed by drying to prepare a prepreg, and press bonding a metal foil, e.g., a copper foil, on the prepreg or a plurality of the prepregs under heating to cure the resin composition.

In order to eliminate disadvantages associated with the use of a solvent in the resin impregnation stated above, it has been proposed to use a substantially solvent-free impregnating thermosetting resin composition which comprises a room temperature liquid epoxy resin, a curing agent for epoxy resins, an epoxy vinyl ester resin and/or an unsaturated polyester resin, and a polymerizable vinyl monomer, containing no solvent other than the polymerizable vinyl monomer as disclosed in JP-A-59-49240 (the term "JP-A" as used herein means an "unexamined published Japanese patent application"). According to this technique, laminates are obtained by impregnating the thermosetting resin composition into a fibrous base followed by heating to convert the resin components into the B-stage, and press-molding the resulting prepregs under heating.

However, this process involves various disadvantages as follows. (1) In order to endow the impregnating thermosetting resin composition with impregnating properties into fibrous bases, a large quantity of the polymerizable vinyl monomer should be incorporated into the composition, making it very difficult to obtain tack-free and soft prepregs in a short time. (2) As compared with an epoxy resin alone, the impregnating resin composition containing a polymerization reactive epoxy vinyl ester resin or unsaturated polyester resin in combination with a polyaddition reactive epoxy resin exhibits markedly improved molding properties. However, metal foil peel strength and interlaminar peel strength would be reduced according as the compounding ratio of the epoxy vinyl ester resin or unsaturated polyester resin containing the polymerizable vinyl monomer increases. (3) Addition of high-molecular weight epoxy resins or rubber components for the purpose of improving various physical properties of the resulting laminates would result in an increase of viscosity of the impregnating resin composition, which reduces impregnation properties into fibrous bases. Therefore, the amounts of these compounding additives are limited to very small ratios. (4) If, for the purpose of improving impregnating properties of the resin composition, the proportion of the polymerizable vinyl monomer to be combined with the epoxy vinyl ester resin and/or unsaturated polyester resin is increased, metal foil peel strength or interlaminar peel strength would be further reduced. A combined use of a solvent is possible, but if removal of the solvent is incomplete, soldering resistance of the resulting laminate is greatly impaired.

SUMMARY OF THE INVENTION

In the light of the above-stated circumstances, the inventors have conducted extensive investigations and, as a result, found that impregnation can be carried out easily to provide prepregs and laminated sheets free from the above-described disadvantages by impregnating a fibrous base with an impregnating resin composition comprising a room temperature liquid epoxy resin, an epoxy resin curing agent, a resin containing an unsaturated group (hereinafter referred to as an unsaturated resin), a room temperature liquid polymerizable vinyl monomer, and a polymerization initiator as essential components and containing no solvent and then removing the polymerizable vinyl monomer present in the resulting impregnated base. In order to obtain tack-free and soft prepregs in a short time, it was proved preferable that the impregnated bases should be heated individually without being laid up to thereby effect removal of the polymerizable vinyl monomer and conversion to the B-stage simultaneously. For the production of laminated sheets in a continuous system, it was confirmed that individual heating of each of the impregnated bases is not always necessary and that the impregnated bases may be laid up and then heated altogether to conduct removal of the polymerizable vinyl monomer simultaneously with precure. The present invention has been completed based on these findings.

The present invention relates to a process for producing a prepreg comprising impregnating a fibrous base with an impregnating resin composition essentially comprising ($A_1$) a room temperature liquid epoxy resin, ($A_2$) an epoxy resin curing agent, ($B_1$) an unsaturated resin, ($B_2$) a room temperature liquid polymerizable vinyl monomer, and ($B_3$) a polymerization initiator and containing no solvent other than the polymerizable vinyl monomer ($B_2$), to obtain an impregnated base, and then conducting removal of the polymerizable vinyl monomer present in the impregnated base and conversion of the resin components to the B-stage.

The present invention further relates to a process for producing a laminated sheet comprising impregnating a fibrous base with an impregnating resin composition essentially comprising ($A_1$) a room temperature liquid epoxy resin, ($A_2$) and epoxy resin curing agent, ($B_1$) an unsaturated resin, ($B_2$) a room temperature liquid polymerizable vinyl monomer, and ($B_3$) a polymerization initiator and containing no solvent other than the polymerizable vinyl monomer ($B_2$), to obtain an impregnated base, removing the polymerizable vinyl monomer present in the impregnated base, overlaying a metal foil on at least one side of the impregnated base if desired, and heat-molding the impregnated base.

DETAILED DESCRIPTION OF THE INVENTION

The room temperature liquid epoxy resin which can be used in the present invention as the component ($A_1$) includes solventless epoxy resins which are liquid at room temperature and a mixture thereof. Those having an average epoxy equivalent of from 100 to 400, preferably from 100 to 250, are usually employed. Typical examples of such epoxy resins are epoxy resins which are obtained by reacting epichlorohydrin with a dihydric phenol, e.g., bisphenol A, bisphenol F, and resorcin; polyglycidyl ethers of polyhydric alcohols, e.g., ethylene glycol, propylene glycol, polyethylene glycol, polypropylene glycol, neopentyl glycol, glycerin, trimethylolethane, trimethylolpropane, and an ethylene oxide or propylene oxide adduct of a dihydric phenol; polyglycidyl esters of polycarboxylic acids, e.g., adipic acid, phthalic acid, tetrahydrophthalic acid, hexahydrophthalic acid, and a dimer acid; cyclohexene-based epoxy compounds obtainable by epoxidation of cyclohexene or a derivative thereof, for example, with peracetic acid (e.g., 3,4-epoxy-6-methylcyclohexyl-3,4-epoxy-6-methylcyclohexane carboxylate, 3,4-epoxycyclohexylmethyl-3,4-epoxycyclohexane carboxylate, and 1-epoxyethyl-3,4-epoxycyclohexane); cyclopentadiene-based epoxy compounds obtainable by epoxidation of cyclopentadiene or a derivative thereof, for example, with peracetic acid (e.g., cyclopentadiene oxide, dicyclopentadiene oxide, and 2,3-epoxycyclopentyl ether); limonene dioxide; and a glycidyl ether ester of hydroxybenzoic acid; each of which is liquid without a solvent at room temperature. Preferred among them are room temperature liquid epoxy resins obtained from epichlorohydrin and bisphenol A in view of well-balanced performance properties and unexpensiveness; and room temperature liquid cyclohexane-based epoxy compounds in view of low viscosity.

The component (A₁) may be a mixture of at least one of the aforesaid room temperature liquid epoxy resins and one or more room temperature solid epoxy resins. In this case, a powderous epoxy resin having a mean particle size of from 50 to 500 μm, preferably from 100 to 300 μm, is usually used as dissolved and/or dispersed in the room temperature liquid epoxy resin(s). Typical examples of such room temperature solid epoxy resins are epoxy resins or phenoxy resins obtainable from epichlorohydrin and a dihydric phenol, e.g., bisphenol A, bisphenol F, resorcin, tetrabromobisphenol A, tetrabromobisphenol F, and bisphenol S; polyglycidyl ethers of polyhydric phenols, e.g., phenol-, alkylphenol- or brominated phenol-novolak resins; co-condensed epoxy resins comprising a dihydric phenol and a novolak resin; co-condensed epoxy resins comprising a polyglycidylamine of a polyamine (e.g., aniline, p- or m-aminophenol, diaminodiphenylmethane), a polyglycidyl ether of the above-enumerated polyhydric alcohol, a polycarboxylic acid polyglycidyl ester, or a hydroxybenzoic acid glycidyl ether ester and a dihydric phenol alone or a mixture of the dihydric phenol and a monohydric phenol; and triglycidyl isocyanurate; each of which has a melting point of 50° C. or higher. Preferred of them are a powderous epoxy resin obtained from epichlorohydrin and bisphenol A in view of well-balanced performance and unexpensiveness; ultrahigh-moleuclar weight phenoxy resins, e.g., PKHH (a trade name, produced by UCC, U.S.A.), in view of obtaining high compression moldability and high performance properties at a low compounding ratio; powderous polyphydric phenol polyglycidyl ethers in view of excellent heat resistance; and a powderous epoxy resin obtained from epichlorohydrin and tetrabromobisphenol A and a powderous brominated polyhydric phenol polyglycidyl ethers in view of excellent flame retardance.

The epoxy resin curing agent which can be used as the component (A₂) includes, taking pot life into consideration, aromatic polyamines, polybasic acid anhydrides, boron trifluoride-amine complexes (latent curing agent), dicyandiamide and its derivatives, dibasic acid hydrazides, diaminomaleonitrile and its derivatives, melamine and its derivatives, and salts of amines, imides or polyamines. Preferred of them are polybasic acid anhydrides.

Implicit in the polybasic acid anhydrides are those which are solid at room temperature and those which are liquid at room temperature. These compounds are used either individually or in combination thereof. When used alone, the room temperature liquid polybasic acid anhydrides are preferred in view of their excellent compatibility with other components to provide an impregnating resin composition having low viscosity and excellent impregnating properties. In order to improve heat resistance of laminated sheets without reducing compatibility with other components and impregnating properties, it is preferably to use a solution type acid anhydride prepared by dissolving a polyfunctional room temperature solid acid anhydride in a room temperature liquid acid anhydride.

Examples of the room temperature solid polybasic acid anhydride are polyadipic anhydride, polyazelaic anhydride, polysebacic anhydride, methylcyclohexenedicarboxylic anhydride, trimellitic anhydride, pyromellitic anhydride, glycerol tristrimellitate, and tetrabasic acid anhydrides represented by formula (I):

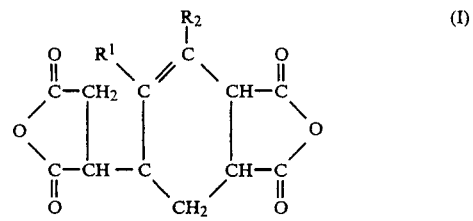

wherein $R_1$ and $R_2$ each represents a hydrogen atom or an alkyl group having from 1 to 3 carbon atoms. Among them, the tetrabasic acid anhydrides of formula (I) are preferred because they exhibit satisfactory solubility in the room temperature liquid polybasic acid anhydrides and satisfactory compatibility with epoxy resins, providing prepregs and laminated sheets excellent in heat resistance and nonhygroscopicity. In particular, 5-(2,5-dioxotetrahydro-3-furanyl)-3-methyl-3-cyclohexene-1,2-dicarboxylic acid anhydride is preferred.

Examples of the room temperature liquid polybasic acid anhydride include polybasic alicyclic acid anhydrides, e.g., methyltetrahydrophthalic anhydride, methylhexahydrophthalic anhydride, methylendomethylenetetrahydrophthalic anhydride, endomethylenetetrahydrophthalic anhydride, methylendomethylenehexahydrophthalic anhydride and endomethylenehexahydrophthalic anhydride; polybasic aliphatic acid anhydrides, e.g., dodecylsuccinic anhydride, dodecenylsuccinic anhydride, and octenylsuccinic anhydride; and polybasic acid anhydride eutectic mixtures containing tetrahydrophthalic anhydride, hexahydrophthalic anhydride, etc. Preferred are methyltetrahydrophthalic anhydride and methylhexahydrophthalic anhydride from the standpoint of low viscosity.

Methods of dissolving the room temperature solid polybasic acid anhydride in the room temperature liquid polybasic acid anhydride are not particularly restricted. For example, dissolving can be effected by stirring them usually at 20° to 200° C. for at least 30 minutes, preferably at 60° to 180° C. for 45 minutes to 48 hours, in the presence of an acidic compound or basic compound. The acidic or basic compound to be used is not always required to be liquid. In using a solid compound, it may be removed from the resulting solution of the room temperature solid polybasic acid anhydride, for example, by filtration.

The acidic compound to be used includes hydrochloric acid, nitric acid, sulfuric acid, sulfonic acid, active clay, acid clay, synthetic silica alumina, and an acidic ion exchange resin, with sulfonic acid, active clay, acid clay, synthetic silica alumina, and acidic ion exchange resins being preferred.

The basic compound to be used includes alkali metal hydroxides, e.g., sodium hydroxide, potassium hydroxide, and lithium hydroxide; alkaline earth metal hydroxides, e.g., magnesium hydroxide, and calcium hydroxide; amines, e.g., dimethylamine, trimethylamine, diethylamine, triethylamine, diisopropylamine, monoethanolamine, diethanolamine, triethanolamine, methylethanolamine, dimethylethanolamine, methyldiethanolamine, N-methylethanolamine, N,N-dimethylethanolamine, monoisopropanolamine, nonylamine, dimethylaminopropylamine, diethylaminopropylamine, and α-benzyldiethanolamine; and imidazoles, e.g., 2-methylimidazole, 2-methyl-4-ethylimidazole, 2-isopropylimidazole, 2-undecylimidazole, 2-phenylimidazole, 2-phenyl-4-methylimidazole, and 1-benzyl-2-methylimidazole, with amines and imidazoles being preferred. Particularly preferred are amines having a hydroxyl group, with N,N-dimethylethanol amine being more preferred.

A ratio of the solid polybasic acid anhydride to the liquid polybasic acid anhydride ranges from 5/95 to 90/10, preferably from 15/85 to 80/20, by weight. The amount of the acidic or basic compound to be used widely varies depending on the activity thereof. Usually, it is used in an amount of from 0.1 to 20 parts by weight, preferably from 0.3 to 15 parts by weight, per 100 parts by weight of the total polybasic acid anhydride.

If desired, the above-described liquid epoxy resin $A_1$) and epoxy resin curing agent ($A_2$) may be used in combination with a curing accelerator or other additives. Examples of usable curing accelerators include various amines, e.g., diethylamine, triethylamine, diisopropylamine, monoethanolamine, diethanolamine, triethanolamine, methylethanolamine, methyldiethanolamine, monoisopropanolamine, nonylamine, dimethylaminopropylamine, diethylaminopropylamine, α-benzylethanolamine, 2,4,6-tris-dimethylaminomethylphenol or a tri-2-ethyl hexylate thereof, 2-dimethylaminomethylphenol, pyridine, piperidine, N-aminopropylmorpholine, 1,8-diazabicyclo(5,4,0)undecene-7 or its salt with phenol, 2-ethylhexanoic acid, oleic acid, diphenylphosphorous acid, an organophosphorous-containing acid; metal salt complexes, e.g., complexes between 2-methylimidazole, 2-isopropylimidazole, 2-undecylimidazole, 2-phenylimidazole, 2- phenyl-4-methylimidazole, 1-benzyl-2-methylimidazole, or imidazole and Cu, Ni, or Co; imidazoles, e.g., cyanoethylated imidazole obtained by reacting 2-methylimidazole with acrylonitrile, or its adduct with trimellitic acid, or its reaction product with dicyandiamide, boron trifluoride-amine complexes, e.g., $BF_3$-monoethanolamine, $BF_3$-benzylamine, $BF_3$-dimethylaniline, $BF_3$-triethylamine, $BF_3$-n-hexylamine, $BF_3$-2,6-diethylaniline, $BF_3$-aniline, and $BF_3$-piperidine; amineimide compounds prepared from 1,1-dimethylhydrazine; phosphorus compounds, e.g., triphenyl phosphite; and organic acid metal salts, e.g., tin octylate.

The unsaturated resin which can be used in the present invention as the component ($B_1$) includes resins containing a polymerizable unsaturated group, preferably a radical polymerizable carbon-carbon double bond, and capable of curing on polymerization reaction of the unsaturated group. Typical examples of such unsaturated resins include epoxy vinyl ester resins, urethane acrylate resins, polyester acrylate resins, unsaturated polyester resins, diallyl phthalate resins, spiran resins, and addition polymerization type polyimides. Preferred among them are the epoxy vinyl ester resins and/or unsaturated polyester resins, with the epoxy vinyl ester resins being particularly preferred because of their excellence in heat resistance and adhesion to metal foils.

The epoxy vinyl ester resins to be used as the unsaturated resin ($B_1$) include, for example, those obtained by reacting one or more of various epoxy resins as recited above, preferably bisphenol type or novolak type epoxy resins, with an unsaturated monobasic acid in the presence of a catalyst for esterification.

The unsaturated monobasic acid typically includes acrylic acid, methacrylic acid, cinnamic acid, crotonic acid, monomethyl maleate, monopropyl maleate, monobutyl maleate, sorbic acid, and mono(2-ethylhexyl) maleate. These compounds may be used either individually or in combination of two or more thereof.

Implicit also in the epoxy vinyl ester resin as referred to herein are carboxyl-containing epoxy vinyl ester resins which are obtained by reacting the above-recited epoxy vinyl ester resin and a dibasic acid anhydride. The dibasic acid anhydride to be used is selected, for example, from those of the above-enumerated specific examples for polybasic acid anhydrides, including phthalic anhydride, hexahydrophthalic anhydride, tetrahydrophthalic anhydride, methylhexahydrophthalic anhydride, methyltetrahydrophthalic anhydride, nudic anhydride, methylnudic anhydride, maleic anhydride, succinic anhydride, and itaconic anhydride.

The unsaturated polyester resin which can be used as the component ($B_1$) includes those obtained by reacting dibasic acids including unsaturated dibasic acids with polyhydric alcohols.

Typical examples of the unsaturated dibasic acid to be used include maleic acid, maleic anhydride, fumaric acid, and halogenated maleic anhydrides. Other dibasic acids which may be called saturated dibasic acid typically include phthalic acid, phthalic anhydride, halogenated phthalic anhydrides, isophthalic acid, terephthalic acid, tetrahydrophthalic anhydride, succinic acid, adipic acid, and sebacic acid. Typical examples of the polyhydric alcohols are ethylene glycol, diethylene glycol, triethylene glycol, propylene glycol, dipropylene glycol, 1,3-butylene glycol, 1,4-butylene glycol, neopentyl glycol, hydrogenated bisphenol A, 1,6-hexanediol, an adduct of bisphenol A and ethylene oxide or propylene oxide, glycerin, and trimethylolpropane.

The epoxy vinyl ester resin or unsaturated polyester resin ($B_1$) can be prepared from the above-described starting materials in accordance with conventionally known techniques. In the preparation of these resins, it is recommended to use a polymerization inhibitor for the purpose of preventing gelation during the preparation or controlling storage stability or curability of the resulting resin.

Specific examples of such a polymerization inhibitor are hydroquinones, e.g., hydroquinone, p-t-butyl catechol, and mono-t-butylhydroquinone; phenols, e.g., hydroquinone monomethyl ether and di-t-p-cresol; quinones, e.g., p-benzoquinone, naphthoquinone, and p-toluquinone; and copper salts, e.g,. copper naphthoate.

The room temperature liquid polymerizable vinyl monomer which can be used in the present invention as the component ($B_2$) includes styrene and its derivatives, e.g., vinyltoluene, t-butylstyrene, chlorostyrene, and divinylbenzene; low-boiling esters of (meth)acrylic acid, e.g., methyl (meth)acrylate, ethyl (meth)acrylate, propyl (meth)acrylate, isopropyl (meth)acrylate, n-butyl (meth)acrylate, isobutyl (meth)acrylate, 2-ethyl-hexyl (meth)acrylate, lauryl (meth)acrylate, 2-hydroxyethyl (meth)acrylate, and 2-hydroxypropyl (meth)acrylate; and polyhydric alcohol (meth)acrylates, e.g., trimethylolpropane tri(meth)acrylate, diethylene glycol di(meth)acrylate, 1,4-butanediol di(meth)acrylate, and 1,6-hexanediol di(meth)acrylate. From the viewpoint of excellent volatility, styrene, vinyltoluene, and low-boiling (meth)acrylates are preferred, with styrene being more preferred. These vinyl monomers may be used either individually or in combination of two or more thereof.

The room temperature liquid vinyl monomer is usually used in an amount of from 20 to 60% by weight based on the total weight of the epoxy vinyl ester resin and/or unsaturated polyester and the vinyl monomer.

The polymerization initiator which can be used in the present invention as the component ($B_3$) preferably includes those decomposable at temperatures below the heat-press molding temperature, such as organic peroxides, e.g., cyclohexanone peroxide, 3,3,5-trimethylcyclohexanone peroxide, methylonexanone peroxide, 1,1-bis(t-butylperoxy) 3,3,5-trimethylcyclohexane, cumene hydroperoxide, dicumyl peroxide, lauroyl peroxide, 3,5,5-trimethylhexanoyl peroxide, benzoyl peroxide, dimyristyl peroxydicarbonate, t-butylperoxy(2-ethylhexanoate), t-butylperoxy-3,5,5-trimethylhexanoate, t-butylperoxy benzoate, and cumyl peroxyoctoate.

The impregnating resin composition which can be used in the present invention is a resin composition capable of being impregnated into a fibrous base, comprising the above-described components ($A_1$), ($A_2$), ($B_1$), ($B_2$), and ($B_3$) as essential components and, if desired, additives, such as a curing accelerator, an internal release agent, a pigment, a filler, etc., and containing substantially no solvent other than the component ($B_2$). Of the components constituting the impregnating resin composition, solid components are not necessarily required to be dissolved in liquid components or be molten, and they may be used in a powderous dissolved state in liquid components.

A weight ratio of the sum of the room temperature liquid epoxy resin ($A_1$) and the epoxy resin curing agent ($A_2$) to the unsaturated resin ($B_1$), i.e., $[(A_1)+(A_2)]/[(B_1)]$, usually ranges from 98/2 to 40/60. From the viewpoint of moldability, adhesion to metal foils, especially a copper foil, and interlaminar peel strength, it preferably ranges from 95/5 to 50/50.

Fillers which may be added to the impregnating resin composition if desired are appropriately selected depending on performance properties demanded, working conditions, and the like. Examples of usable fillers are aluminum hydroxide, aluminum silicate, colloidal silica, calcium carbonate, calcium sulfate, mica, talc, titanium dioxide, a quartz powder, zirconium silicate, a glass powder, an asbestos powder, diatomaceous earth, and antimony trioxide.

Modifiers which may be used in the impregnating resin composition if desired are butadiene rubber derivatives, nitrile rubber derivatives, polyacid anhydrides, low-molecular weight polysulfides, phenolic resins, xylene resins, and ketone resins. In particular, butadiene rubber derivatives and nitrile rubber derivatives are preferred because of their effects to improve adhesion to a copper foil and interlaminar peel strength.

In preparing the impregnating resin composition, the method and order of mixing various components are not particularly limited. For example, a resin composition comprising the components ($A_1$) and ($A_2$) and a resin composition comprising the components ($B_2$) and ($B_3$) may be separately prepared and then mixed together. It is recommended that the liquid components are first mixed and then solid components in the form of a powder are dispersed or dissolved therein.

Materials of the fibrous based which can be used in the present invention include glass fiber, carbon fiber, and aromatic polyamide fiber, with glass fiber being preferred. Glass fiber is classified into E-glass, C-glass, A-glass, and S-glass according to raw material, and any kind may be used in the present invention. Forms of the fibrous base include roving, chopped strand mat, continuous mat, cloth, nonwoven cloth, roving cloth, surfacing mat, and chopped strand. The material and form of the fibrous base to be used can be selected appropriately according to the end use and demanded performance of the resulting laminate moldings. If necessary, two or more kinds of materials or forms of bases may be used in combination. Preferred forms are cloth and nonwoven cloth.

In the production of the prepregs or laminated sheets according to the present invention, it is preferable to impregnate the fibrous base with the impregnating resin composition in such a volume proportion that the fibrous base occupies from 30 to 70% by volume of the impregnated base after removal of the polymerizable vinyl monomer.

After impregnation, the polymerizable vinyl monomer is removed from the impregnated based. The method of removing the polymerizable vinyl monomer is not particularly restricted. For example, the removal can be achieved by heating the impregnated bases either individually or in the form of a layup to vaporize the polymerizable vinyl monomer. At this time, precure or B-stage conversion of the impregnated resin may be effected simultaneously, or a part of the polymerizable vinyl monomer may be reacted.

In the case where a plurality of the impregnated bases are laid up for removal of the polymerizable vinyl monomer, the number of the impregnated bases to be laid up is usually from 2 to 15, preferably from 3 to 10.

The heating temperature for the vaporization of the polymerizable vinyl monomer and the precure or B-stage conversion of the resin usually ranges from 70° to 150° C., preferably from 90° to 140° C. If it is lower than 70° C., the polymerizable vinyl monomer is hardly vaporized, and if it exceeds 150° C., the reaction between the components ($A_1$) and ($A_2$) and the reaction between the components ($B_1$), ($B_2$) and ($B_3$) simultaneously proceed in the resin, resulting in difficulty in assuring proper fluidity of the resin during heat molding.

Vaporization of the polymerizable vinyl monomer can be carried out effectively by a method comprising blowing hot air to the impregnated base, a method comprising heating and sucking or reducing pressure either simultaneously or separately, a method of using infrared rays or far infrared rays, and a method of using highfrequency heating. These treatments can be performed in an inert gas atmosphere, preferably in nitrogen gas. The inert gas atmosphere preferably has an oxygen concentration of not more than 3 mol%.

It is preferably that the polymerizable vinyl monomer should be removed to such a degree that the remaining polymerizable vinyl monomer content in the impregnated base after the removal, inclusive of prepregs after the removal and precure, (hereinafter referred to as impregnated dried base) may be reduced to 8.0% by weight or less based on the resin content in the impregnated dried base. In particular, when a plurality of the impregnated bases are laid up and subjected to removal of the polymerizable vinyl monomer and precure, the aforesaid remaining vinyl monomer content is preferably controlled within a range of from 6.0 to 1.0% by weight from the standpoint of metal foil peel strength and interlaminar peel strength. On the other hand, when the individual impregnated base is separately subjected to removal of the vinyl monomer and B-stage conversion, the aforesaid content is preferably controlled to not more than 4.0% by weight, more preferably not more than 2.0% by weight.

The remaining polymerizable vinyl monomer can be quantitatively determined by immersing the impregnated dried base after the vinyl monomer removal in a solvent, e.g., acetone, for a whole day and analyzing the eluted monomer by gas chromatography.

The terminology "precure" and "B-stage conversion" as used herein mean such a reaction progress that the viscosity of the resin components increases to such a degree that fluidity at room temperature and zero pressure is substantially lost. The resin components having reached the precured state or B-stage again aquires fluidity on heating to a temperature of 140° C. or higher to reach a cured state. Inter alia, the terminology "B-stage conversion" means a such reaction progress that the surface of the impregnated base becomes tack-free or nearly tack-free. It is desirable that the precure or B-stage conversion be conducted to such a degree that a ratio of the resin content which is run off the impregnated base on heat-pressing the impregnated base on a flat plate under conditions of 150° C. and 15 kg/cm$^2$ (i.e., run-off ratio) should fall within a range of from 4 to 35% by weight based on the total resin content.

The laminated sheet according to the present invention can be obtained by heat-molding a single or, if desired, two or more impregnated dried bases thus prepared with a release film and/or a metal foil being overlaid on each side thereof, by the use of a known pressing machine, such as a static press and a continuous belt press. The molding temperature usually ranges from 130° to 220° C., preferably from 140° to 180° C., and the molding pressure usually ranges from contact pressure to 50 kg/cm$^2$, preferably from 5 to 40 kg/cm$^2$. In the case of molding using a static press, the impregnated dried base is cut to size and laid up. In the case of molding using a continuous belt press, the impregnated dried base of continuous length may be continuously molded after, if desired, laid up. After removal from the pressing machine, the laminated sheet may be subjected to postcure if desired.

In laminating, two or more different impregnated dried bases obtained by using impregnating resin compositions differring in compounding ratio of the resin components may be combined to meet the end use. Further, the impregnated dried base according to the present invention may be combined with prepregs prepared from other resin compositions.

The present invention is now illustrated in greater detail by way of the following Examples and Comparative Examples, but it should be understood that the present invention is not deemed to be limited thereto. In these examples, all the parts and percents are given by weight unless otherwise specified.

EXAMPLE 1

In 16.9 parts of a room temperature liquid epoxy resin having an epoxy equivalent of 190 which was obtained from bisphenol A and epichlorohydrin was dissolved 26.5 parts of an epoxy resin having an epoxy equivalent of 370 which was obtained from tetrabromobisphenol A and epichlorohydrin. Then, 43.4 parts of the resulting epoxy resin mixture, 26.6 parts of methyltetrahydrophthalic anhydride, 0.7 part of benzyldimethylamine, 30 parts of an epoxy vinyl ester resin composition consisting of 60% of a methacrylate of an epoxy resin having an epoxy equivalent of 370 which was obtained from tetrabromobisphenol A and epichlorohydrin and 40% of a styrene monomer, 0.3 part of dimyristyl peroxydicarbonate, and 0.2 part of cumene hydroperoxide were mixed to prepare an impregnating resin composition (I-1) having a viscosity of 650 cps and a bromine content of 20%.

The resin composition (I-1) was impregnated into glass cloth of 0.18 mm in thickness, 300 mm in length and 300 mm in width to obtain an impregnated base (III-1) having a (I-1)/glass cloth weight ratio of 48/52. The impregnated base (III-1) was dried by heating in a circulating hot-air direr at 120° C. for 6 minutes to effect removal of the styrene monomer and B-stage conversion. There was obtained a prepreg (IV-1) having a remaining styrene monomer content of 0.8% based on the resin components and a (I-1)/glass cloth weight ratio of 42/58. The resulting prepreg (IV-1) was tack-free and exhibited softness sufficient for taking off in roll form, proving excellent in handling workability.

Eight sheets of the resulting prepreg (IV-1) were laid up, and a 35 μm thick copper foil was adhered to each side thereof. A mirror-finished stainless steel sheet was overlaid on each of the copper foils, and kraft paper was further placed on each of the stainless steel sheets as a cushioning. The laminated structure was put in a heat pressing machine (a static press) heated to 170° C., compressed under a pressure of 10 kg/cm$^2$ for 5 minutes and then heat-molded under a pressure of 40 kg/cm$^2$ for 60 minutes, followed by cooling to 30° C. while keeping the pressure to obtain a 1.6 mm thick laminated sheet.

The thus obtained laminated sheet was evaluated for various physical properties according to the following measurement methods. The results obtained are shown in Table 1.

(1) Copper Foil Peel Strength:
Measured according to JIS C-6481.
(2) Interlaminar Peel Strength:
The outermost fibrous base with the copper foil thereon was peeled off the adjacent fibrous base at a peel angle of 90°, and the peel strength was measured by means of a tensile tester "Tension" (a trade name, manufactured by Toyo Sokuki K. K.) at a peel rate of 5 cm/min.
(3) Water Absorption:
After the copper foil on one side of the laminated sheet was removed by etching, the laminated sheet was subjected to pressure cooker test under conditions of 120° C. and 2 atms. for 4 hours. The water absorption was calculated according to equation:

$$\text{Water Absorption (\%)} = \frac{W' - W}{W} \times 100$$

wherein W is a weight of the laminated sheet before the test; and W' is a weight of the laminated sheet after the test.

(4) Resistance to Soldering Temperature:

The same sample as prepared in the measurement of water absorption was tested according to JIS C-6481.

(5) Glass Transition Temperature (Tg):

Measured at a heating rate of 1° C./min by means of a dynamic solid viscoelasticity measuring device, "RSA-II" manufactured by Rheometric Co.

COMPARATIVE EXAMPLE 1

The same impregnating resin composition as prepared in Example 1 (I-1) was impregnated into the same glass cloth as used in Example 1 to obtain an impregnated base (III-1') having a (I-1)/glass cloth weight ratio of 42/58. The impregnated base (III-1') was sandwitched in between 1.6 mm thick polyethylene terephthalate (PET) films and heated in a hot-air drier at 120° C. for 5 minutes to effect B-stage conversion. Thereafter, the PET films were stripped off to obtain a tack-free prepreg (IV-1'). The resulting prepreg, although tack-free, was found to lack in softness.

A laminated sheet having a thickness of 1.6 mm was produced in the same manner as in Example 1, except for using the above-prepared prepregs (IV-1') and evaluated in the same manner as in Example 1, except for Tg measurement. The results obtained are shown in Table 1. It was noted that the laminated sheet contained much void.

COMPARATIVE EXAMPLE 2

A prepreg (IV-2') was prepared in the same manner as in Comparative Example 1, except for changing the drying time condition of B-stage conversion to 4 minutes. The resulting prepreg (IV-2') was tacky and poor in handling properties.

A 1.6 mm thick laminated sheet was produced from the prepregs (IV-2') in the same manner as in Example 1 and evaluated in the same manner as in Example 1 except for Tg measurement. The results obtained are shown in Table 1.

COMPARATIVE EXAMPLE 3

Eight impregnated bases (III-1') as obtained in Comparative Example 1 were laid up, and a 35 μm thick copper foil was adhered on both sides thereof. The laidup prepregs were sandwitched in between a pair of mirror-finished sheets and then between a pair of cushionings. The laminated structure was pressed in a pressing machine set at room temperature under contact pressure. The pressing machine was then heated from room temperature up to 150° C. over a period of 9 minutes to convert the resin components to the B-stage. Immediately after the temperature reached 150° C., the laminated structure was compression molded at an initial pressure of 15 kg/cm² for 3 minutes and then at 40 kg/cm² for 60 minutes, followed by cooling to 30° C. while keeping that pressure, to obtain a 1.6 mm thick laminated sheet. Physical properties of the resulting laminated sheet except for Tg were measured in the same manner as in Example 1, and the results obtained are shown in Table 1.

COMPARATIVE EXAMPLE 4

In 19.3 parts of a room temperature liquid epoxy resin having an epoxy equivalent of 190 which was obtained from bisphenol A and epichlorohydrin was dissolved 30.3 parts of an epoxy resin having an epoxy equivalent of 370 which was obtained from tetrabromobisphenol A and epichlorohydrin. The resulting epoxy resin mixture (49.6 parts), 30.4 parts of methyltetrahydrophthalic anhydride, 0.7 part of benzyldimethylamine, 20 parts of a methacrylate of an epoxy resin having an epoxy equivalent of 370 which was obtained from tetrabromobisphenol A and epichlorohydrin, 0.3 part of dimyristyl peroxydicarbonate, and 0.2 part of cumene hydroperoxide were mixed to prepare an impregnating resin composition (I-4') having a viscosity of 5,500 cps and containing no polymerizable vinyl monomer. The composition (I-4') had a high viscosity due to absence of a polymerizable vinyl monomer and hence found difficulty in uniformly impregnating into glass cloth. However difficult it may be, the resin composition (I-4') was impregnated into glass cloth in the same manner as in Comparative Example 1. A 1.6 mm thick laminated sheet was produced from the resulting prepregs in the same manner as in Comparative Example 3 and evaluated in the same manner as in Example 1 except for Tg measurement. The results obtained are shown in Table 1.

EXAMPLE 2

An impregnating resin composition (I-2) was prepared in the same manner as in Example 1, except for replacing the epoxy vinyl ester resin (30 parts) with 20 parts of the same epoxy vinyl ester resin and 10 parts of a diallyl phthalate resin consisting of 6 parts of a diallyl phthalate prepolymer and 4 parts of a diallyl phthalate monomer.

A prepreg (IV-2) having a remaining styrene monomer content of 0.2% based on the resin components was obtained in the same manner as in Example 1, except for using the above-prepared impregnating resin composition (I-2). The resulting prepreg (IV-2) had a (I-2)/glass cloth weight ratio of 42/58 and was found to be tack-free and sufficiently soft for taking off in roll form, proving excellent in handling workability.

A 1.6 mm thick laminated sheet was produced from the prepreg (IV-2) in the same manner as in Example 1 and evaluated in the same manner as in Example 1 except for Tg measurement. The results obtained are shown in Table 1.

EXAMPLE 3

A bisphenol A type liquid epoxy resin having an epoxy equivalent of 190 (24.5 parts), 3.6 parts of a high-molecular weight bisphenol A type epoxy resin having an epoxy equivalent of 2,700, a melting point of 147° C., and an average particle size of 130 μm, 23.4 parts of methylnudic anhydride, 0.2 part of benzyldimethylamine, 35.7 parts of an epoxy vinyl ester resin consisting of 70% of a methacrylate of a phenol novolak type epoxy resin having an epoxy equivalent of 184 and 30% of a styrene monomer, 9 parts of a styrene monomer, and 1.8 parts of benzoyl poxide were mixed to prepare an impregnating resin composition (I-3) having dissolved therein a high-molecular weight bisphenol A type epoxy resin.

The resulting composition (I-3) was impregnated into the same glass cloth as used in Example 1 to obtain an impregnated base (III-3) having a (I-3)/glass cloth weight ratio of 50/50. The impregnated base was dried by heating at 120° C. for 6 minutes to remove the styrene monomer and to convert the resin components to the B-stage to obtain a prepreg (IV-3) having a remaining styrene monomer content of 0.5% based on the resin components. The prepreg (IV-3) had a (I-3)/glass cloth weight ratio of 42/58 and was tack-free and sufficiently soft for taking off in roll form, proving excellent in handling workability.

A 1.6 mm thick laminated sheet was produced from the prepregs (IV-3) in the same manner as in Example 1 and evaluated in the same manner as in Example 1 except for Tg measurement. The results obtained are shown in Table 1.

COMPARATIVE EXAMPLE 5

In the same manner as in Example 3, except for replacing the styrene monomer (9 parts) with 9 parts of methyl ethyl ketone, a 1.6 mm thick laminated sheet was produced. Physical properties of the laminated sheet except for Tg were evaluated in the same manner as in Example 1, and the results obtained are shown in Table 1. When the impregnated base obtained was dried by heating at 120° C. for 6 minutes to obtain a prepreg (IV-5'), the remaining styrene monomer content and the remaining methyl ethyl ketone content of the prepreg (IV-5') were 0.2% and 0.4%, respectively, based on the resin components. Determination of methyl ethyl ketone was made in the same manner as described for determination of the polymerizable vinyl monomer.

EXAMPLE 4

An impregnating resin composition (I-4) was prepared in the same manner as in Example 1, except for replacing 0.7 part of benzyldimethylamine with 0.7 part of 2-ethyl-4-methylimidazole.

The impregnated resin composition (I 4) was continuously impregnated into glass cloth of continuous length 1,020 mm wide and 0.18 mm thick. After controlling the (I-4)/glass cloth weight ratio to 48/52 by means of a squeeze roll, the impregnated base was dried by continuously heating in a hot-air drier at 110° C. for 6 minutes to effect removal of the styrene monomer and B-stage conversion to obtain a prepreg of continuous length (IV-4). The prepreg (IV-4) had a remaining styrene monomer content of 0.8% based on the resin components and a (I-4)/glass cloth weight ratio of 42/58 and was tack-free and soft sufficient for taking off in roll form, proving excellent in handling workability.

Eight webs of the above-prepared prepreg (IV-4) were continuously laid up by means of a laminating roll, while placing a 35 μm thick copper foil on each of the uppermost and undermost webs, and carried to a continuous double belt press set at 170° C., continuously pressed at a pressure of 15 kg/cm² for 5 minutes, cooled to 100° C. under pressure, and cut into 1,000 mm lengths with a quillotine cutter. The both ends of the cut sheet were cut. The cut-to-size sheets were subjected to postcure at 160° C. for 1 hour to obtain laminated sheets 1.6 mm wide, 1,000 mm long and 1,000 mm wide. Physical properties of the laminated sheet, except for Tg, were measured in the same manner as in Example 1, and the results obtained are shown in Table 1.

EXAMPLE 5

A room temperature liquid epoxy resin (45.4 parts) having an epoxy equivalent of 190 which was obtained from bisphenol A and epichlorohydrin, 39.5 parts of methyltetrahydrophthalic anhydride, 0.5 part of benzyldimethylamine, 15.0 parts of an unsaturated polyester resin containing 42% of a styrene monomer, and 0.3 part of 1,1-bis(t-butylperoxy)-3,3,5-trimethylcyclohexane were mixed to prepare an impregnating resin composition (I-5).

A continuous prepreg (IV-5) was obtained in the same manner as in Example 4, except that the resin composition (I-5) an prepared above was impregnated into glass cloth to a (I-5)/glass cloth weight ratio of 46/54. The resulting prepreg (IV-5) had a remaining styrene monomer content of 0.6% based on the resin components and a (I-5)/glass cloth weight ratio of 42/58. The prepreg was tack-free and soft sufficient for taking off in roll form, proving excellent in workability on handling.

A 1.6 mm thick laminated sheet was produced in the same manner as in Example 4, except for using the prepreg (IV-5). Physical properties of the resulting laminated sheet, except Tg, were measured in the same manner as in Example 1, and the results obtained are shown in Table 1.

COMPARATIVE EXAMPLE 6

The impregnating resin composition (I-5) prepared in Example 5 was impregnated into glass cloth of continuous length to obtain a continuous impregnated base (III-6') having a (I-5)/glass cloth weight ratio of 42/58. Eight webs of the resulting impregnated base (III-6') were laid up while placing a 35 μm thick copper foil on both sides thereof, heated continuously at 110° C. for 5 minutes in a hot-air drier, and then processed in the same manner as in Example 4 to obtain a laminated sheet having a thickness of 1.6 mm. The physical properties of the resulting laminated sheet as measured in the same manner as in Example 1, except for Tg, are shown in Table 1.

EXAMPLE 6

A room temperature liquid epoxy resin (37.5 parts) having an epoxy equivalent of 190 which was obtained from bisphenol A and epichlorohydrin, 32.6 parts of methylhexahydrophthalic anhydride, 0.23 parts of benzyldimethylamine, 30 parts of an epoxy vinyl ester resin consisting of 70% of a methacrylate of a phenol novolak type epoxy resin having an epoxy equivalent of 184 and 30% of a styrene monomer, and 0.48 part of benzoyl peroxide were mixed to prepare an impregnating resin composition (I-6-a).

The composition (I-6-a) was impregnated into the same glass cloth as used in Example 1 to obtain an impregnated base (III-6-a) having a (I-6-a)/glass cloth weight ratio of 47/53, which was then dried by heating at 120° C. for 5 minutes to remove the styrene monomer and convert the resin components to the B-stage. The resulting prepreg (IV-6-a) had a remaining styrene monomer content of 0.5% based on the resin components and a (I-6a)/glass cloth weight ratio of 42/58 and was tack free and soft sufficient for taking off in roll form, proving excellent in workability on handling.

Separately, an impregnating resin composition (I-6-b) was prepared from 48.2 parts of the above-described epoxy resin (epoxy equivalent: 190), 41.8 parts of methylhexahydrophthalic anhydride, 0.29 part of benzyldimethylamine, 10 parts of an epoxy vinyl ester resin consisting of 70% of a methacrylate of a phenol novolak type epoxy resin having an epoxy equivalent of 184 and 30% of a styrene monomer, and 0.21 part of benzoyl peroxide.

A prepreg (IV-6-b) having a remaining styrene monomer content of 0.6% based on the resin components was prepared in the same manner as described above, except that the impregnating resin composition (I-6-b) was impregnated into the glass cloth at a (I-6-b)/glass cloth weight ratio of 45/55. The resulting prepreg (IV-6-b) had a (I-6-b)/glass cloth weight ratio of 42/58 and was tack-free and soft sufficient for taking off in roll form, proving excellent in workability on handling.

Then, 6 sheets of the prepreg (IV-6-a) were laid up, and one sheet of the prepreg (IV-6-b) was then overlaid on each side thereof. A 35 μm thick copper foil was further overlaid on each side thereof. The laminated structure was processed in the same manner as in Example 1 to obtain a 1.6 mm thick laminated sheet. The physical properties of the resulting laminated sheet, except Tg, as measured in the same manner as in Example 1 are shown in Table 1.

EXAMPLE 7

An impregnating resin composition (I-7) was prepared by mixing 30.5 parts of a room temperature liquid epoxy resin having an epoxy equivalent of 190 which was obtained from bisphenol A and epichlorohydrin, 26.5 parts of methyltetrahydrophthalic anhydride, 0.19 part of benzyldimethylamine, 38.0 parts of an epoxy vinyl ester resin consisting of 70% of a methacrylate of a phenol novolak type epoxy resin having an epoxy equivalent of 184 and 30% of a styrene monomer, 0.80 part of benzoyl peroxide and 5 parts of a carboxyl-terminated butadienenitrile rubber.

The resulting impregnating resin composition (I-7) was impregnated into the same glass cloth as used in Example 1 to obtain an impregnated base (III-7) having a (I-7)/glass cloth weight ratio of 47/53, which was then dried by heating at 120° C. for 5 minutes to effect removal of the styrene monomer and B-stage conversion to obtain a prepreg (IV-7) having a remaining styrene monomer content of 1.2% based on the resin components. The prepreg (IV-7) had a (I-7)/glass cloth weight ratio of 42/58, was tack-free, exhibited sufficient softness for taking off in roll form, and was excellent in handling workability.

A 1.6 mm thick laminated sheet was obtained from the prepregs (IV-7) in the same manner as in Example 1. The physical properties, except Tg, of the laminated sheet as measured in the same manner as in Example 1 are shown in Table 1.

EXAMPLE 8

A prepreg (IV-8) having a remaining styrene monomer content of 0.9% based on the resin components was prepared in the same manner as in Example 1, except that the removal of the styrene monomer and B-stage conversion were effected at 120° C. for 4 minutes in a circulating hot-air drier while introducing nitrogen into the drier from the lower part thereof and degassing from the upper part thereof so as to maintain a nitrogen gas atmosphere (oxygen concentration: 0.8 mol%). The resulting prepreg (IV-8) was tack-free and had softness enough to take off in roll form, proving excellent in handling workability.

A 1.6 mm thick laminated sheet was produced using the prepregs (IV-8) in the same manner as in Example 1. The physical properties of the laminated sheet are shown in Table 1.

The glass transition temperature (Tg) of the laminated sheet as measured with a dynamic solid viscoelasticity measuring device was found to be 148° C., which was higher than that of the laminated sheet obtained in Example 1 by 8° C.

TABLE 1

| | Ex. 1 | Comp. Ex. 1 | Comp. Ex. 2 | Comp. Ex. 3 | Comp. Ex. 4 | Ex. 2 | Ex. 3 | Comp. Ex. 5 | Ex. 4 | Ex. 5 | Comp. Ex. 6 | Ex. 6 | Ex. 7 | Ex. 8 |
|---|---|---|---|---|---|---|---|---|---|---|---|---|---|---|
| Copper Foil Peel Strength (kg. cm) | 2.1 | 1.8 | 1.8 | 1.8 | 1.9 | 2.0 | 2.0 | 2.0 | 2.1 | 2.0 | 1.8 | 2.2 | 2.1 | 2.1 |
| Interlaminar Peel Strength (kg. cm) | 2.0 | 1.4 | 1.4 | 1.4 | 1.6 | 2.0 | 2.0 | 2.0 | 2.0 | 2.0 | 1.5 | 2.1 | 2.0 | 2.0 |
| Water Absorption (%) | 0.15 | 0.35 | 0.15 | 0.15 | 0.40 | 0.14 | 0.15 | 0.17 | 0.14 | 0.15 | 0.15 | 0.14 | 0.16 | 0.11 |
| Resistance to Soldering Temperature (260° C.) | good | poor | good | good | poor | good | good | poor | good | good | good | good | good | good |
| Tg (°C.) | 140 | — | — | — | — | — | — | — | — | — | — | — | — | 148 |

EXAMPLE 9

The impregnated resin composition (I-1) prepared in Example 1 was continuously impregnated into each of 8 webs of glass cloth 1,020 mm wide and 0.18 mm thick. The resulting 8 impregnated bases of continuous length were laid up, passed under a squeeze roll to adjust the (I-1)/glass cloth weight ratio of 46/54, and then continuously heated in a hot-air drier at 110° C. for 6 minutes to effect removal of the styrene monomer and precuring to thereby obtain an impregnated dried base (IV-9) of continuous length. The impregnated dried base (IV-9) had a remaining styrene monomer content of 3.0% based on the resin components and a (I-1)/glass cloth weight ratio of 42/58.

A 35 μm thick copper foil of continuous length was overlaied on each side of the laid-up impregnated dried base (IV-9) by means of a laminating roll, carried to a continuous double belt press heated at 170° C., continuously press molded under a pressure of 15 kg/cm² for 5 minutes, cooled to 100° C. under that pressure, and cut to 1,000 mm lengths with a guillotin cutter. After cutting the both ends, the cut-to-size laminated structures were postcured at 160° C. for 1 hour to obtain laminated sheets of 1.6 mm in thickness, 1,000 mm in length, and 1,000 mm in width. The physical properties of the resulting laminated sheet are shown in Table 2.

COMPARATIVE EXAMPLE 7

The impregnated resin composition (I-1) prepared in Example 1 was continuously impregnated into each of 8 webs of glass cloth having a width of 1,020 mm and a thickness of 0.18 mm. The resulting 8 webs of the impregnated base were laid up, passed under a squeeze roll to adjust the (I-1)/glass cloth weight ratio to 42/58. A 35 μm thick copper foil of continuous length was overlaid on each side of the laid-up impregnated base. The laminated structure was carried to a continuous double belt press, heated at 110° C. for 3 minutes under contact pressure to perform precure without vaporizing styrene. The prepreg laminate was then continuously press molded in the double belt press under a pressure of 15 kg/cm² at 170° C. for 5 minutes, cooled to 100° C. under pressure, and cut with a guillotin cutter. The laminate was subjected to postcure at 160° C. for 1 hour to obtain a laminated sheet of 1.6 mm in thickness. The physical properties of the laminated sheet, except Tg, were measured in the same manner as in Example 1, and the results obtained are shown in Table 2.

COMPARATIVE EXAMPLE 8

A 1.6 mm thick laminated sheet was produced in the same manner as in Example 9, except for using the impregnating resin composition (I-4') prepared in Comparative Example 4 in place of the composition (I-1). The physical properties, except Tg, of the resulting laminated sheet are shown in Table 2.

EXAMPLE 10

An impregnated dried base laminate (IV-10) having a remaining styrene monomer content of 2.0% based on the resin components was prepared in the same manner as in Example 9, except for changing the number of the impregnated glass cloth webs to be laid up to 4. The impregnated dried base laminate (IV-10) was processed in the same manner as in Example 9 to obtain a laminated sheet having a thickness of 0.8 mm. The physical properties, except Tg, of the resulting laminated sheet are shown in Table 2.

EXAMPLE 11

An impregnated dried base laminate (IV-11) having a remaining styrene monomer content of 1.0% based on the resin components was prepared in the same manner as in Example 9, except for using the impregnated resin composition (I-2) prepared in Example 2 in place of the resin composition (I-1). A 1.6 mm thick laminated sheet was produced from the impregnated dried base laminate (IV-11) in the same manner as in Example 9. The physical properties of the laminated sheet, except Tg, are shown in Table 2.

EXAMPLE 12

The impregnating resin composition (I-3) prepared in Example 3 was continuously impregnated into each of 8 webs of the same glass cloth as used in Example 9 to a (I-3)/glass cloth weight ratio of 48/52. The 8 webs of the impregnated glass cloth were laid up and continuously dried by heating at 120° C. for 4 minutes to effect removal of the styrene monomer and precure. The resulting impregnated dried base laminate (IV-12) had a remaining, styrene monomer content of 4.2% based on the resin components.

A 1.6 mm thick laminated sheet was produced from the impregnated dried base laminate (IV-12) in the same manner as in Example 9. The physical properties of the laminated sheet, except Tg, are shown in Table 2.

EXAMPLE 13

The impregnating resin composition (I-5) prepared in Example 5 was continuously impregnated into each of 8 webs of the same glass cloth as used in Example 9 at a (I-5)/glass cloth weight ratio of 45/55. The 8 webs of the impregnated base were laid up and continuously heat-dried at 120° C. for 6 minutes to effect removal of the styrene monomer and precure. The resulting impregnated dried base laminate (IV-13) had a remaining styrene monomer content of 2.0% based on the resin components. A 1.6 mm thick laminated sheet was produced from the impregnated dried base laminate (IV-13) in the same manner as in Example 9. The physical properties of the laminated sheet, except Tg, are shown in Table 2.

EXAMPLE 14

Six impregnated bases (III-6-a) prepared in Example 6 were laid up, and one impregnated base (III-6-b) prepared in Example 6 was overlaid on each side of the impregnated base laminate. The laminated structure was dried by heating at 120° C. for 5 minutes to effect removal of the styrene monomer and precure to obtain an impregnated dried base laminate (IV-14) having a remaining styrene monomer content of 1.8% based on the resin components. After a 35 μm thick copper foil was further placed on each side of the laminate, the laminated structure was further processed in the same manner as in Example 9 to obtain a 1.6 mm thick laminated sheet. The physical properties of the laminated sheet, except Tg, are shown in Table 2.

EXAMPLE 15

The impregnating resin composition (I-7) prepared in Example 7 was continuously impregnated into each of 8 webs of the same glass cloth as used in Example 9 to prepare 8 webs of impregnated base having a (I-7)/glass cloth weight ratio of 45/55. These webs were laid up and continuously dried by heating at 120° C. for 5 minutes to remove the styrene monomer and to conduct precure to obtain an impregnated dried base laminate (IV-15) having a remaining styrene monomer content of 3.2% based on the resin components. The resulting impregnated dried base laminate was processed in the same manner as in Example 9 to obtain a 1.6 mm thick laminated sheet. The physical properties of the laminated sheet, except Tg, are shown in Table 2.

EXAMPLE 16

An impregnated dried base laminate (IV-16) having a remaining styrene monomer content of 1.9% based on the resin components was prepared in the same manner as in Example 9, except that the removal of the styrene monomer and the precure were effected by heating in a circulating hot-air drier at 120° C. for 4 minutes while introducing nitrogen gas into the drier from the lower side thereof and degassing from the upper part thereof to keep it in a nitrogen atmosphere (oxygen concentration: 0.8 mol%).

A 1.6 mm thick laminated sheet was obtained in the same manner as in Example 9, except for using the impregnated dried base laminate (IV-16). The results of physical property measurements are shown in Table 2. The glass transition temperature (Tg) of the laminated sheet as measured by means of a dynamic solid viscoelasticity measuring device was found to be 165° C., which was higher than those of the laminated sheets obtained in Examples 1 and 9 by 25° C. and 5° C., respectively.

TABLE 2

|  | Ex. 9 | Comp. Ex. 7 | Comp. Ex. 8 | Ex. 10 | Ex. 11 | Ex. 12 | Ex. 13 | Ex. 14 | Ex. 15 | Ex. 16 |
| --- | --- | --- | --- | --- | --- | --- | --- | --- | --- | --- |
| Copper Foil Peel Strength (kg. cm) | 2.1 | 1.9 | 1.9 | 2.1 | 2.0 | 2.0 | 2.0 | 2.2 | 2.1 | 2.0 |
| Interlaminar Peel Strength (kg. cm) | 1.9 | 1.6 | 1.6 | 1.9 | 1.9 | 1.9 | 1.9 | 2.0 | 1.9 | 1.9 |
| Water Absorption (%) | 0.15 | 0.15 | 0.40 | 0.15 | 0.14 | 0.15 | 0.15 | 0.14 | 0.16 | 0.15 |
| Resistance to Soldering Temperature (260° C.) | good | good | poor | good | good | good | good | good | good | good |
| Tg (°C.) | 160 | — | — | — | — | — | — | — | — | 165 |

REFERENCE EXAMPLES 1 TO 4

Preparation of Curing Agent ($A_2$):

The components shown in Table 3 below were mixed and stirred at 80° C. for 2 hours to obtain a liquid curing agent ($A_2$-1) to ($A_2$-4).

TABLE 3

| Composition (part) | Ref. Ex. 1 $A_2$-1 | Ref. Ex. 2 $A_2$-2 | Ref. Ex. 3 $A_2$-3 | Ref. Ex. 4 $A_2$-4 |
| --- | --- | --- | --- | --- |
| | | Curing Agent | | |
| 5-(2,5-Dioxotetrahydro-3-furanyl)-3-methyl-3-cyclohexene-1,2-dicarboxylic acid anhydride | 50 | 30 | 10 | — |
| 5-(2,5-Dioxotetrahydro-3-furanyl)-4-methyl-3-cyclohexene-1,2-dicarboxylic acid anhydride | — | — | — | 30 |
| Methyltetrahydrophthalic anhydride | 50 | 70 | 90 | — |
| Methylendomethylenetetrahydrophthalic anhydride | — | — | — | 70 |
| N,N-Dimethylethanolamine | 0.35 | 0.35 | 0.35 | — |
| 2-Methyl-4-ethylimidazole | — | — | — | 5.0 |

EXAMPLE 17

A uniform impregnating resin composition (I-17) was prepared in the same manner as in Example 1, except for replacing 26.6 parts of methyltetrahydrophthalic anhydride as used in Example 1 with 23.9 parts (equivalent ratio to the epoxy resin=1.0) of ($A_2$-1) as prepared in Reference Example 1.

In the same manner as in Example 1, but using the resin composition (I-17), a prepreg (IV-17) having a (I-17)/glass cloth weight ratio of 42/58 was obtained. The prepreg (IV-17) was tack-free and exhibited sufficient softness for taking off in roll form, proving excellent in handling properties.

A 1.6 mm thick laminated sheet was produced from the prepreg (IV-17) in the same manner as in Example 1. The physical properties of the laminated sheet are shown in Table 4.

EXAMPLES 18 TO 20

A prepreg and a laminated sheet were prepared in the same manner as in Example 17, except for replacing 23.9 parts of ($A_2$-1) with 24.9 parts of ($A_2$-2) (Example 18), 26.2 parts of ($A_2$-3) (Example 19), or 26.1 parts ($A_2$-4) (Example 20). The physical properties of the each of the resulting laminated sheets are shown in Table 4.

EXAMPLE 21

Ninety-seven parts of the impregnating resin composition (I-17) prepared in Example 17 were mixed with 3 parts of a carboxyl-terminated butadiene-nitrile rubber and 5 parts of a styrene monomer to prepare a uniform impregnating resin composition (I-21).

The resulting composition (I-21) was continuously impregnated into each of 8 webs of glass cloth of 1,020 mm in width and 0.18 mm in thickness. The 8 webs of the impregnated base were laid up, and after adjusting the (I-21)/glass cloth weight ratio to 47/53 by means of a squeeze roll, continuously dried by heating in a hot-air drier at 110° C. for 6 minutes to effect removal of the styrene monomer and precure. The resulting impregnated dried base laminate (IV-21) of continuous length had a remaining styrene monomer content of 3.0% based on the resin components and a (I-21)/glass cloth weight ratio of 42/58.

A 35 μm thick copper foil was continuously overlaid on each side of the impregnated dried base laminate (IV-21) by means of a laminating roll, and the laminated structure was carried to a continuous double belt press set at 170° C., where it was continuously heatpressed under a pressure of 15 kg/cm$^2$ for 5 minutes, followed by cooling to 100° C. under that pressure. The continuous sheet was cut to 1,000 mm lengths, and both ends were cut with a guillotin cutter. The cut-to-size sheet was then postcured at 160° C. for 1 hour to obtain a laminated sheet having a thickness of 1.6 mm, a length of 1,000 mm, and a width of 1,000 mm. The physical properties of the resulting laminated sheet are shown in Table 4.

TABLE 4

|  | Example 17 | Example 18 | Example 19 | Example 20 | Example 21 |
| --- | --- | --- | --- | --- | --- |
| Copper Foil Peel Strength (kg. cm) | 2.0 | 2.0 | 2.1 | 2.0 | 2.2 |
| Interlaminar Peel Strength (kg. cm) | 1.9 | 2.0 | 2.0 | 2.0 | 2.2 |
| Water Absorption (%) | 0.14 | 0.15 | 0.15 | 0.14 | 0.15 |
| Soldering Resistance (260° C.) | good | good | good | good | good |
| Tg (°C.) | 162 | 160 | 153 | 158 | 161 |

As in apparent from the results of the foregoing examples and comparative examples, tack-free and soft prepregs can be obtained by conducting removal of a polymerizable vinyl monomer and conversion of the resin components to the B-stage after impregnation. A laminated sheet obtained from such a prepreg exhibits markedly improved copper foil peel strength and interlaminar peel strength.

As demonstrated in Examples 3, 7, 15, and 21, the present invention further makes it possible to use a high-molecular weight epoxy resin or a high-molecular weight rubber component in an attempt to improve other physical properties of the laminated sheet. In other words, the present invention offers a wider choice of materials. This is attributed to the fact that the polymerizable vinyl monomer in the impregnating resin composition is removed during the preparation of prepregs so that an arbitrary quantity of the polymerizable vinyl monomer may be used for the preparation of the impregnating resin composition.

Considering that an organic solvent, if employed in place of the polymerizable vinyl monomer, remaining in laminated sheets even in a small proportion causes reduction of resistance to soldering as revealed in Comparative Example 5, the process of the present invention is valuable in that the polymerizable vinyl monomer is used to serve as a solvent and the remaining monomer is finally reacted.

When the removal of the polymerizable vinyl monomer and the conversion to the B-stage are carried out in an inert gas atmosphere, since the anaerobic unsaturated resin ($B_1$) and the remaining polymerizable vinyl monomer can be polymerized to a sufficient degree to thereby increase crosslinking density, the resulting laminated sheet has a further increased glass transition temperature and a further reduced water adsorption.

Further, heat resistance of the laminated sheet can be improved by using a solution type epoxy resin curing agent comprising a room temperature solid polybasic acid anhydride dissolved in a room temperature liquid polybasic acid anhydride.

While the invention has been described in detail and with reference to specific embodiments thereof, it will be apparent to one skilled in the art that various changes and modifications can be made therein without departing from the spirit and scope thereof.

What is claimed is:

1. A process for producing a prepreg comprising impregnating a fibrous base with an impregnating resin composition consisting essentially of ($A_1$) a room temperature liquid epoxy resin, ($A_2$) an epoxy resin curing agent having an average epoxy equivalent of from 100 to 400, a resin containing a polymerizable unsaturated group, ($B_2$) a room temperature liquid polymerizable vinyl monomer having 4 to 18 carbon atoms, ($B_3$) a polymerizable initiator and containing no solvent other than said polymerizable vinyl monomer ($B_2$), to obtain an impregnated base, and then removing the polymerizable vinyl monomer present in said impregnated base and converting the resin components to the B-stage.

2. A process for preparing a prepreg as claimed in claim 1, wherein said removing the polymerizable vinyl monomer and converting the resin components to the B-stage are carried out simultaneously by heating said impregnated base.

3. A process for preparing a prepreg as claimed in claim 1, wherein said removing the polymerizable vinyl monomer is carried out until a remaining polymerizable vinyl monomer content is reduced to 4% by weight or less based on the resin components.

4. A process for preparing a prepreg as claimed in claim 1, wherein said epoxy resin curing agent is a polybasic acid anhydride, said resin containing a polymerizable unsaturated group is selected from the group consisting of an epoxy vinyl ester resin, an unsaturated polyester resin, and a mixture thereof, and said impregnating resin composition further comprises a curing accelerator.

5. A process for preparing a prepreg as claimed in claim 1, wherein a weight ratio of the sum of the room temperature liquid epoxy resin ($A_1$) and the epoxy resin curing agent ($A_2$) to the resin containing a polymerizable unsaturated group ($B_1$), (($A_1$)+($A_2$))/($B_1$) is from 98/2 to 40/60.

6. A process for preparing a prepreg as claimed in claim 1, wherein said epoxy resin curing agent is a solution of a room temperature solid polybasic acid anhydride dissolved in a room temperature liquid polybasic acid anhydride.

7. A process for preparing a prepreg as claimed in claim 1, wherein said epoxy resin curing agent is a solution prepared by dissolving a tetrabasic acid anhydride represented by formula (I):

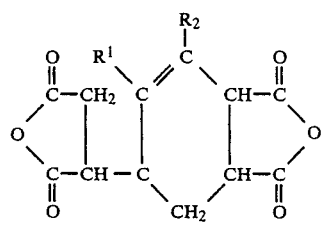

wherein $R_1$ and $R_2$ each represents a hydrogen atom or an alkyl group having from 1 to 3 carbon atoms, in a room temperature liquid dibasic acid anhydride in the presence of an acidic compound.

8. A process for preparing a prepreg as claimed in claim 7, wherein a weight ratio of the tetrabasic acid anhydride to the room temperature liquid dibasic acid anhydride is from 15/85 to 80/20.

9. A process for producing a laminated sheet comprising impregnating a fibrous base with an impregnating resin composition consisting essentially of ($A_1$) a room temperature liquid epoxy resin having an average epoxy equivalent of from 100 to 400, ($A_2$) an epoxy resin curing agent, ($B_1$) a resin containing a polymerizable unsaturated group, ($B_2$) a room temperature liquid polymerizable vinyl monomer having 4 to 18 carbon atoms, and ($B_3$) a polymerizable initiator and containing no solvent other than said polymerizable vinyl monomer ($B_2$), to obtain an impregnated base, removing the polymerizable vinyl monomer present in said impregnated base, and heat molding the impregnated base from which the polymerizable vinyl monomer has been removed.

10. A process for preparing a laminated sheet as claimed in claim 9, wherein said process further comprises laying up a plurality of said impregnated base and said laid-up impregnated base laminate is heated to remove the polymerizable vinyl monomer until a remaining polymerizable vinyl monomer content is reduced to 8% by weight or less based on the resin components and simultaneously to precure said impregnated base laminate.

11. A process for preparing a laminated sheet as claimed in claim 9, wherein said impregnated base is heated individually to remove the polymerizable vinyl monomer until a remaining polymerizable vinyl monomer content is reduced to 4% by weight or less based on the resin components and simultaneously to convert the impregnated base to the B-stage.

12. A process for preparing a laminated sheet as claimed in claim 9, wherein said epoxy resin curing agent is a polybasic acid anhydride, said resin containing a polymerizable unsaturated group is selected from the group consisting of an epoxy vinyl ester resin, an unsaturated polyester resin, and a mixture thereof, and said impregnating resin composition further comprises a curing accelerator.

13. A process for preparing a laminated sheet as claimed in claim 9, wherein a weight ratio of the sum of the room temperature liquid epoxy resin ($A_1$) and the epoxy resin curing agent ($A_2$) to the resin containing an unsaturated group ($B_1$), (($A_1$)+($A_2$))/($B_1$) is from 98/2 to 0/60.

14. A process for preparing a laminated sheet as claimed in claim 9, wherein said epoxy resin curing agent is a solution of a room temperature solid polybasic acid anhydride dissolved in a room temperature liquid polybasic acid anhydride.

15. A process for preparing a laminated sheet as claimed in claim 9, wherein said epoxy resin curing agent is a solution prepared by dissolving a tetrabasic acid anhydride represented by formula (I):

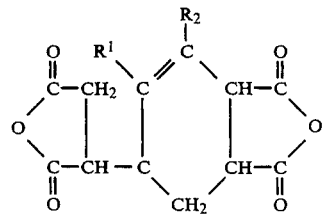
(I)

wherein $R_1$ and $R_2$ each represents a hydrogen atom or an alkyl group having from 1 to 3 carbon atoms, in a room temperature liquid dibasic acid anhydride in the presence of an acidic compound.

16. A process for preparing a laminated sheet as claimed in claim 15, wherein a weight ratio of the tetrabasic acid anhydride to the room temperature liquid dibasic acid anhydride is from 15/85 to 80/20.

17. A process for preparing a laminated sheet as claimed in claim 9, wherein said process further comprises overlaying a metal foil on at least one side of said impregnated base from which the polymerizable vinyl monomer has been removed.

18. A process for preparing a prepreg as claimed in claim 1, wherein said epoxy resin curing agent is a solution prepared by dissolving a tetrabasic acid anhydride represented by formula (I):

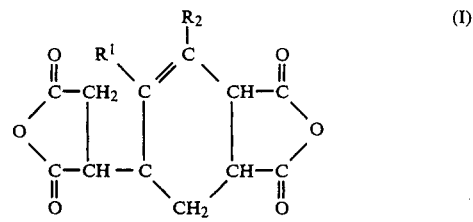
(I)

wherein $R_1$ and $R_2$ each represents a hydrogen atom or an alkyl group having from 1 to 3 carbon atoms, in a room temperature liquid dibasic acid anhydride in the presence of a basic compound.

19. A process for preparing a laminated sheet as claimed in claim 9, wherein said epoxy resin curing agent is a solution prepared by dissolving a tetrabasic acid anhydride represented by formula (I):

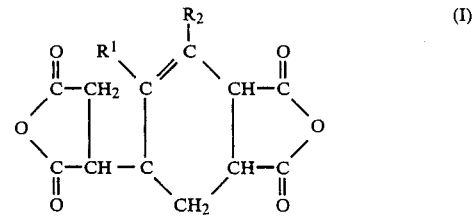
(I)

wherein $R_1$ and $R_2$ each represents a hydrogen atom or an alkyl group having from 1 to 3 carbon atoms, in a room temperature liquid dibasic acid anhydride in the presence of a basic compound.

* * * * *